United States Patent [19]
Lu

[11] Patent Number: 6,062,301
[45] Date of Patent: May 16, 2000

[54] KNOCKDOWN CPU HEAT DISSIPATER

[75] Inventor: Chun Hsin Lu, Taipei, Taiwan

[73] Assignee: Foxconn Precision Components, Co., Ltd., Taipei Shien, Taiwan

[21] Appl. No.: 09/222,576

[22] Filed: Dec. 28, 1998

[30] Foreign Application Priority Data

Jun. 23, 1998 [TW] Taiwan ................................. 87210001

[51] Int. Cl.[7] ..................................................... H05K 7/20
[52] U.S. Cl. ......................... 165/80.3; 165/121; 361/697
[58] Field of Search ................................... 165/80.3, 121, 165/185; 361/697, 704, 710; 257/722; 174/16.3

[56] References Cited

U.S. PATENT DOCUMENTS

| | | | |
|---|---|---|---|
| 5,020,586 | 6/1991 | Mansingh | 165/80.3 |
| 5,419,041 | 5/1995 | Ozeki | 29/890.03 |
| 5,509,465 | 4/1996 | Lai | 165/80.3 |
| 5,583,317 | 12/1996 | Mennucci et al. | 174/16.3 |
| 5,777,259 | 7/1998 | Mennucci et al. | 174/16.3 |
| 5,864,464 | 1/1999 | Lin | 361/697 |
| 5,947,192 | 9/1999 | Kuo | 165/80.3 |

*Primary Examiner*—Allen Flanigan
*Attorney, Agent, or Firm*—Wei Te Chung

[57] ABSTRACT

A heat dissipater for a CPU consists of a hood and a radiator. The hood has two side walls one defining a number of holes and the other forming a number of pegs. The radiator consists of a number of base plates and a number of fin plates each being interposed between two adjacent base plates. Each base plate forms a number of pegs on one side thereof and defines a number of recesses on the other side in alignment with the pegs. The pegs extend through a neighboring fin plate into recesses in a neighboring base plate thereby assembling the fin plates and the base plates together. When the radiator is mounted to the hood, the pegs in one side wall of the hood are fittingly received in the corresponding recesses of the base plate immediately adjacent to the side wall and the holes in the other side wall fittingly receive the corresponding pegs of the base plate immediately adjacent to the other side wall thereby assembling the hood and the radiator together to form the heat dissipater.

15 Claims, 4 Drawing Sheets

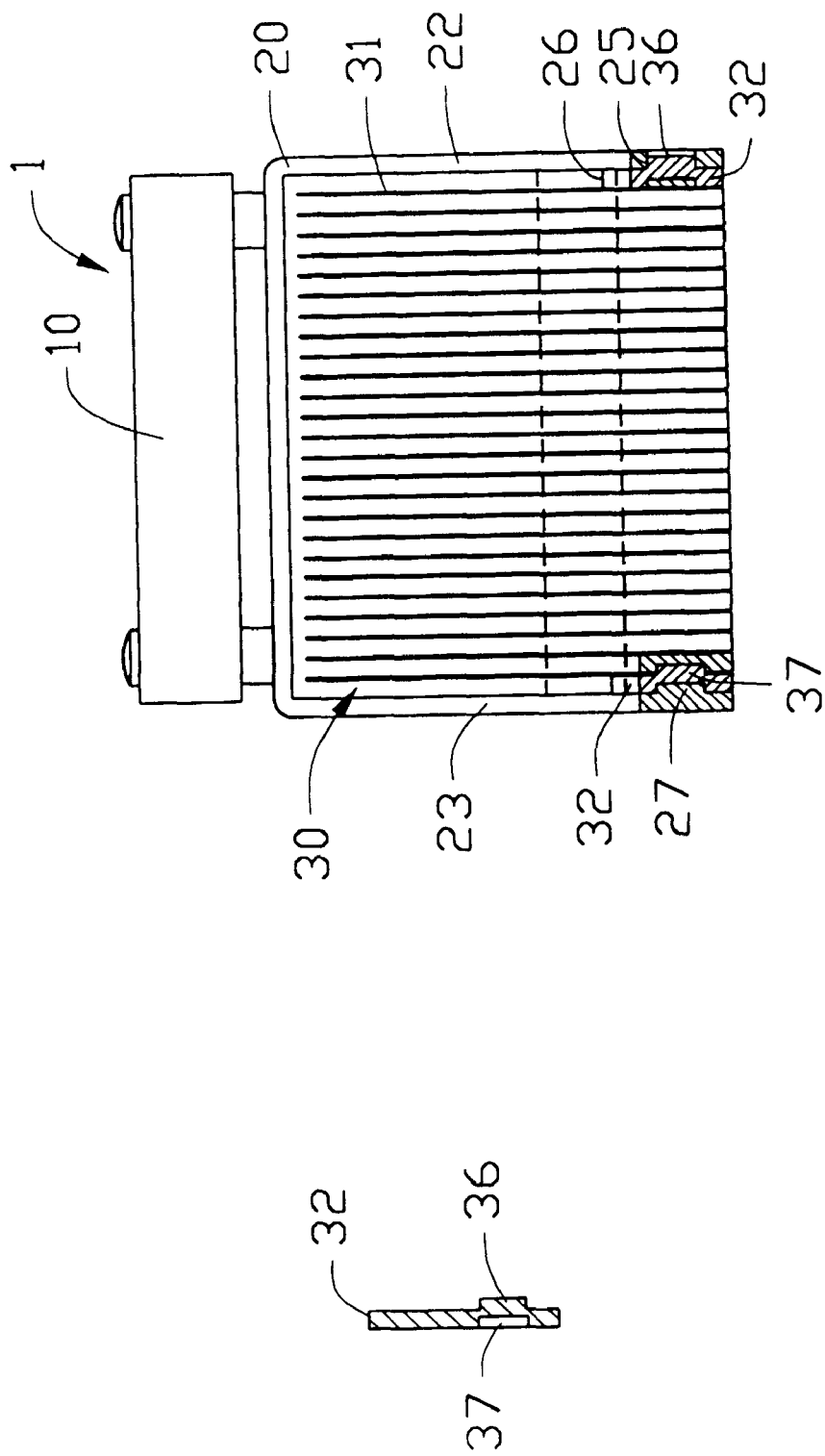

6,062,301

KNOCKDOWN CPU HEAT DISSIPATER

BACKGROUND OF THE INVENTION

1. Field of The Invention

The present invention relates to a heat dissipater for removing heat from a computer central processing unit (CPU), and particularly to a heat dissipater consisting mainly of a plurality of detachable heat dissipating fins.

2. The Prior Art

To maintain a proper working temperature, a CPU of a computer is usually provided with a heat dissipater. The most commonly available heat dissipater on the market is formed by aluminum extrusion. After extrusion, the aluminum stock is subject to a milling and grinding process to obtain a number of heat dissipating fins upwardly projecting from an integral base. For some high speed CPUs, the heat dissipater is mounted with a fan for forcibly removing heat dissipated by the fins.

However, forming the heat dissipating fins by milling and rounding is laborious and costly. In addition, such a machining process produces a large bulk of waste material. Furthermore, the eat dissipater must be discarded if a portion thereof is damaged, for example, a fin thereof breaking due to careless handling.

Hence, an improved heat dissipater for a CPU is needed to eliminate the above mentioned defects of the current art.

SUMMARY OF THE INVENTION

Accordingly, an objective of the present invention is to provide a knockdown CPU heat dissipater formed by detachably assembling separate parts together whereby any damage inflicted thereon can be fixed by replacing only the damaged portion.

Another objective of the present invention is to provide a knockdown CPU heat dissipater formed without the necessity of a costly milling and grounding process thereby not producing a large quantity of waste material.

A further objective of the present invention is to provide a knockdown CPU heat dissipater which may be readily assembled without the use of tools thereby facilitating assembly, maintenance and repair thereof.

To fulfill the above mentioned objectives, according to one embodiment of the present invention, a CPU heat dissipater in accordance with the present invention consists of a U-shaped hood having an a top side defining an air passage about which a fan is mounted and two side walls defining a space therebetween for receiving a radiator therein. The radiator consists of a number of base plates and fin plates alternately and detachably assembled together. Each base plate forms a number of pegs on one side thereof and defines a number of recesses on the other side thereof at a position corresponding to the pegs. Each fin plate defines a number of holes some of which correspond to the pegs. To assemble the base plates and fin plates, the pegs are extended through the corresponding holes in the fin plate into the corresponding recesses in a neighboring base plate whereby a fin plate is sandwiched between the two base plates. The two side walls of the hood are respectively provided with pegs and apertures corresponding to and respectively engageable with the recesses and pegs of the base plates located immediately adjacent thereto for securing the radiator to the hood. The side walls of the hood are resilient for facilitating mounting of radiator to the hood.

BRIEF DESCRIPTION OF THE DRAWINGS

FIG. 4 is a cross-sectional view take along line 4—4 of FIG. 3; and

FIG. 5 is an end view, partially in cross section, of the heat dissipater of the present invention.

DETAILED DESCRIPTION OF THE PREFERRED EMBODIMENT

Reference will now be made in detail to the preferred embodiment of the present invention.

Figure 1:
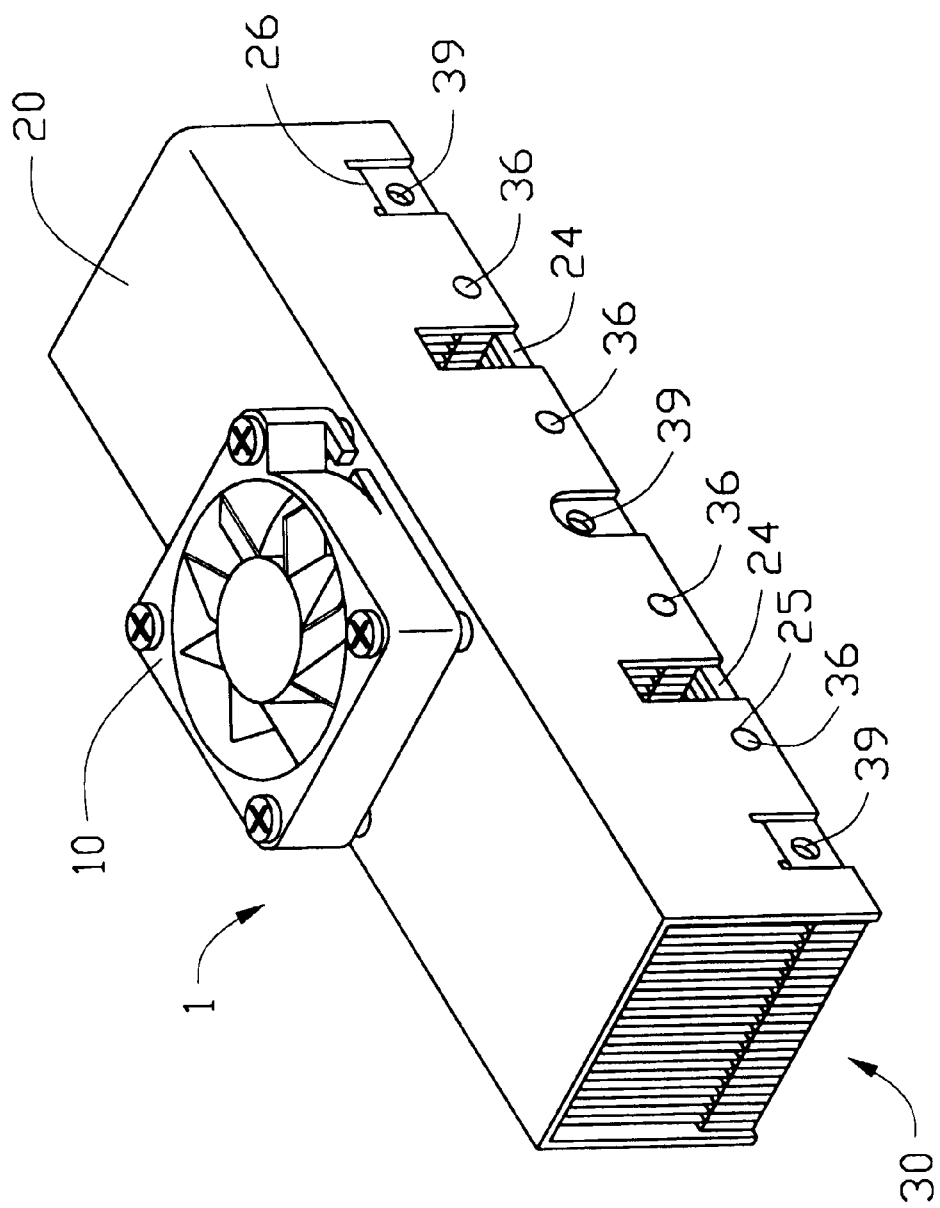
FIG. 1 is a perspective view of a knockdown CPU heat dissipater constructed in accordance with the present invention.
Figure 2:
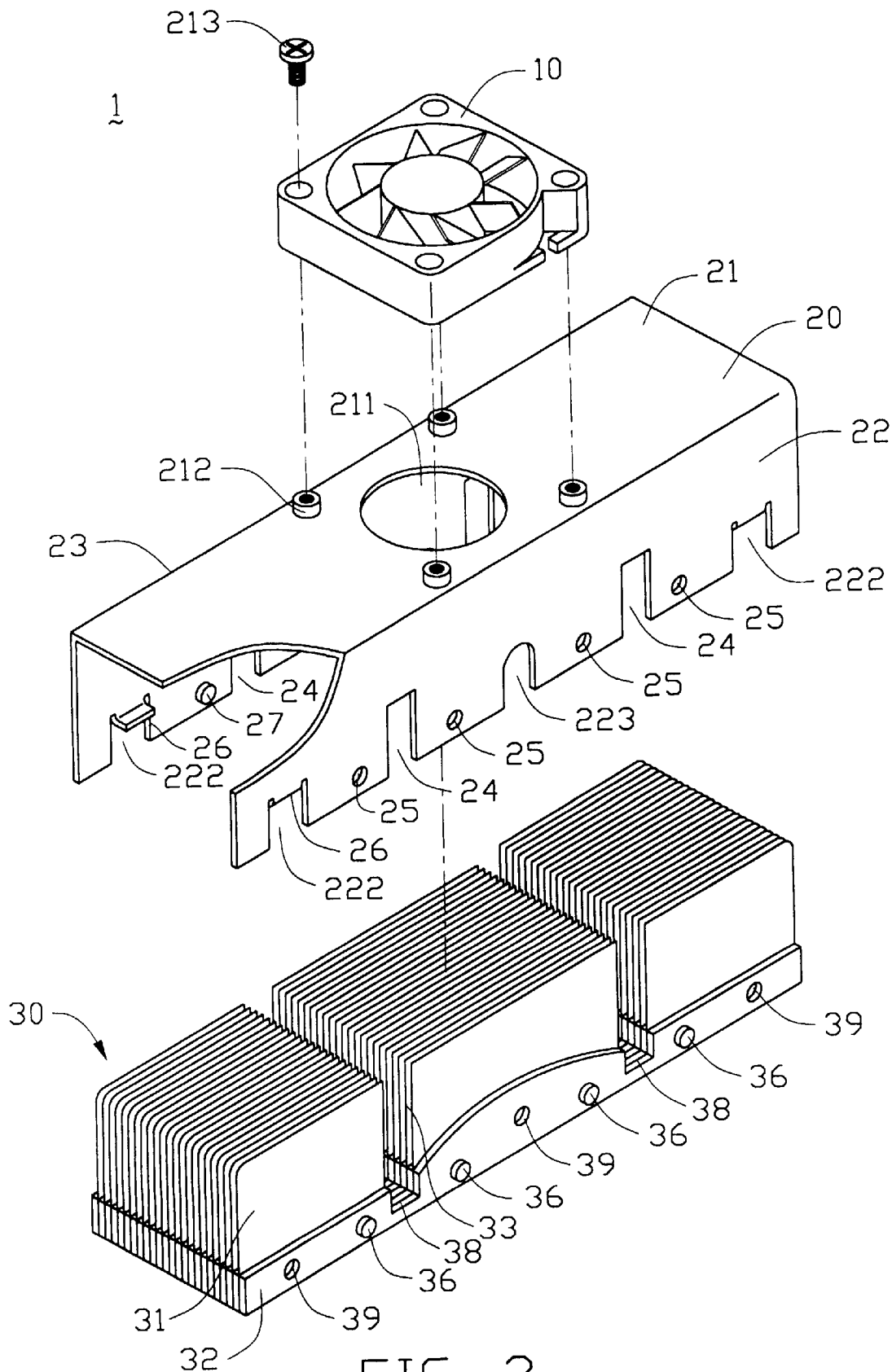
FIG. 2 is an exploded view of the knockdown CPU heat dissipater of FIG. 1.

Referring to FIGS. 1 and 2, a knockdown central processing unit (CPU) heat dissipater 1 constructed in accordance with the present invention consists of a fan 10, a U-shaped hood 20 and a radiator 30 wherein, for clarity, a corner of the hood 20 is cut away in FIG. 2.

The hood 20 has a top wall 21, a first side wall 22 and a second side wall 23 cooperatively defining a space (not labeled) therebetween for receiving the radiator 30 therein. The top wall 21 defines a circular passage 211 in a middle portion thereof. Four nuts 212 are fixed to the top wall 21 around the passage 211. Four screws 213 (only one shown) threadedly engage with the nuts 212 to fix the fan 10 to the hood 21 whereby when the fan 10 is activated, an air flow is forced through the radiator 30 via the passage 211. The first and second side walls 22, 23 have substantially the same configuration, except that the first side wall 22 defines four apertures 25 in a lower portion thereof and the second side wall 23 forms four pegs 27 at positions corresponding to the apertures 25 and extending toward the apertures 25. Beside the apertures 25 and pegs 27, the first and second side walls 22, 23 each define a number of notches in a lower end thereof including two short notches 222, a central notch 223 and two long notches 24 respectively located between the short notches 222 and the central notch 23. A flange 26 inwardly extends from an upper periphery of each short notch 222. The first and second side walls 22, 23 are resilient so that they can be bent away from each other to facilitate mounting of the radiator 30 within the hood 20.

Figure 3:
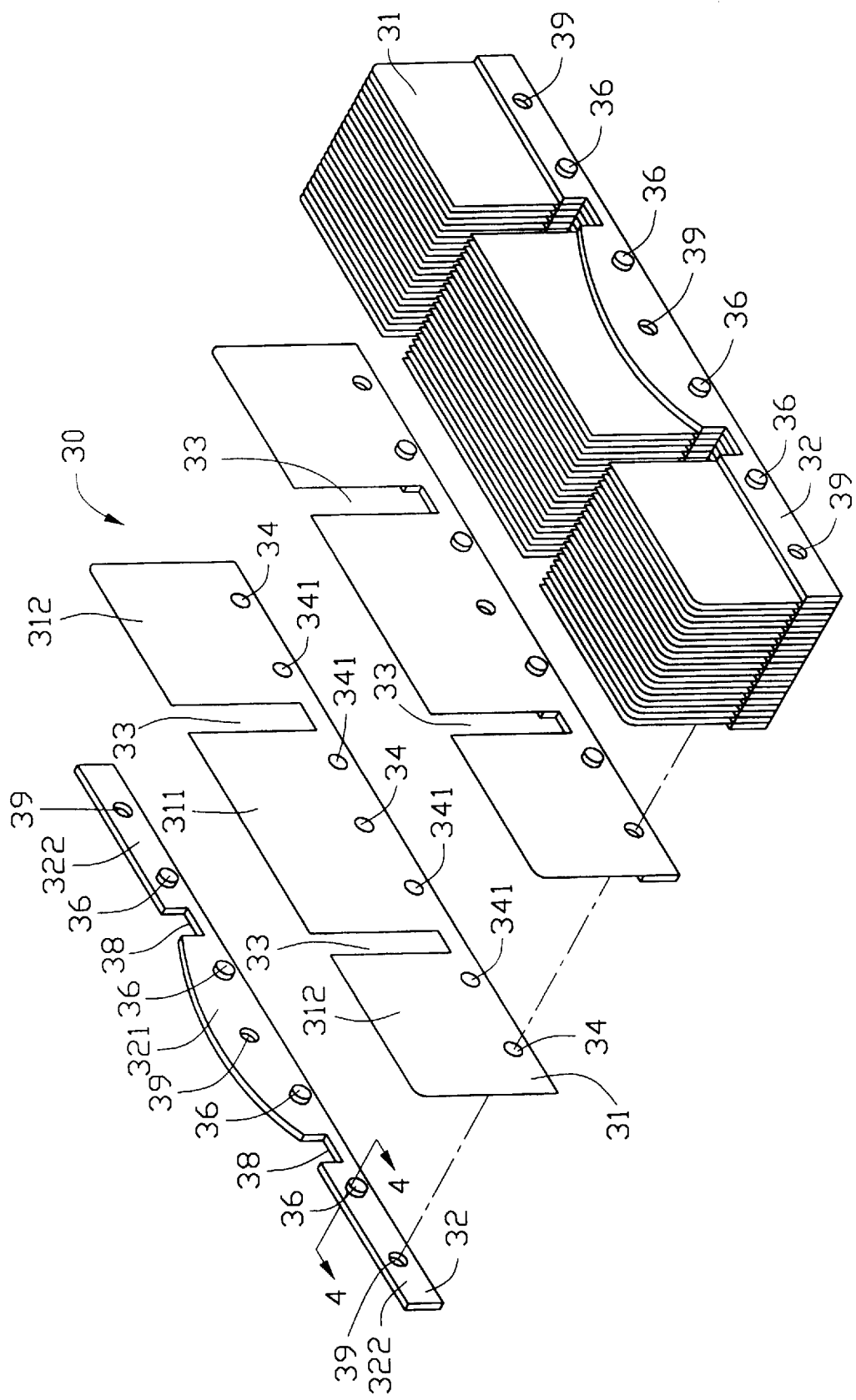
FIG. 3 is an exploded view of a radiator of the heat dissipater of the present invention.

Also referring to FIG. 3, the radiator 30 comprises a number of fin plates 31 and a number of base plates 32. The base plates 32 are alternately arranged with the fin plates 31 whereby a fin plate 31 is sandwiched between each adjacent pair of base plates 32.

Each fin plate 31 comprises a thin plate defining two slots 33 therein in alignment with the long notches 24 of the side walls 22, 23 of the hood 20. The slots 33 divide the fin plate 31 into a middle portion 311 defining two lateral fin plate holes 341 and a middle mounting hole 34 in alignment with the central notch 223 of the side walls 22, 23 of the hood 20, and two lateral portions 312 each defining a fin plate hole 341 and a mounting hole 34 in alignment with the short notches 222 of the side walls 22, 23 of the hood 20. The four fin plate holes 341 are in alignment with the four apertures 25 and four pegs 27 of the side walls 22, 23 of the hood 20.

Each base plate 32 has an elongate strip-like configuration with a predetermined thickness which preferably is greater than the thickness of the fin plate 31. Each base plate 32 has a middle arced portion 321 forming two pegs 36 in alignment with the two lateral fin plate holes 341 in the middle portion 311 of the fin plate 31 and defining a middle hole 39 in alignment with the middle mounting hole 34 in the middle portion 311 of the fin plate 31 and thus the central notches 223 of the side walls 22, 23 of the hood 20. Each base plate 32 further has two lateral rectangular portions 322 each forming a peg 36 in alignment with the fin plate hole 341 of the corresponding lateral portion 312 of the fin plate 31 and defining a hole 39 in alignment with the mounting hole 34 of the corresponding lateral portion 312 of the fin plate 31 and thus the short notches 222 of the side walls 22, 23 of the hood 20. A number of recesses 37 are defined in the base plate 32 in alignment with each peg 36 thereof (FIG. 4). The base plate 32 defines notches 38 therein which separate the middle portion 321 from the lateral portions 322. The notches 38 are aligned with the long notches 24 of the side walls 22, 23 of the hood 20 and thus the slots 33 of the fin plates 31.

The fin plates 31 and the base plates 32 are assembled together whereby each of fin plates 31 is interposed between adjacent base plates 32. The base plate pegs 36 of one of the two mated base plates 32 extend through the corresponding fin plate holes 341 of the interposed fin plate 31 for being fittingly received in the corresponding recesses 37 of the other base plate 32. Thus, the base plates 32 and the fin plates 31 can be easily and efficiently assembled together to form the radiator 30, as shown in FIG. 2. The slots 33 of the fin plate 31 and the notches 38 of the base plate 32 align with each other to form two channels (not labeled) for accommodating fasteners, for example, clips (not shown) for mounting the heat dissipater 1 to the CPU.

As shown in FIGS. 2 and 3, to assemble the radiator 30 to the hood 20, the hood 20 is fit over the fin plates 31 to encase the radiator 20 therein whereby the long notches 24 of the side walls 22, 23 of the hood 20 align with the corresponding channels for accommodating the fasteners which mount the heat dissipater 1 to the CPU. The apertures 25 in the first side wall 22 of the hood 20 fittingly receive the base plate pegs 36 of the base plate 32 located immediately adjacent to the first side wall 22 of the hood 20, and the pegs 27 on the second side wall 23 of the hood 20 are fittingly received in the recesses 37 of the base plate 32 immediately adjacent to the second side wall 23 of the hood 20, as shown in FIG. 5. The flanges 26 abut against top edges of the lateral portions 322 of the outer-most base plates 32 thereby forming a secure engagement between the hood 20 and the radiator 30 without the requirement of a fastening element. The side walls 22, 23 of the hood 20 are resilient for facilitating mounting the radiator 20 to the hood 30.

After the hood 20 and the radiator 30 are assembled together, the short notches 222 and the central notch 23 of the side walls 22, 23 are aligned with the base plate hole 39 and the mounting holes 34 of the fin plates 31 whereby three bores (not labeled) are defined through the dissipater 1 for receiving other means for fixing the dissipater 1 to the CPU.

Referring to FIG. 1, since the assembly of the fin plates 31 and the base plates 32 of the radiator 30 is held together by means of engagement between the base plate pegs 36 and the recesses 37 of the base plates 32 and since the hood 20 is detachable from the radiator 30, the CPU heat dissipater 1 in accordance with the present invention is readily assembled/dissembled. Furthermore, during manufacture of the dissipater 1, a costly milling/grounding operation is not necessary; thus, no waste material will be produced during manufacture. In addition, if damage occurs to one of the fin plates 31, only the damaged fin plate 31 requires replacement thereby further eliminating excess waste. Finally, no tool is required to assemble/disassemble the heat dissipater 1 thereby facilitating maintenance and repair thereof.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:
1. A CPU heat dissipater, comprising:
   a hood comprising a first side wall defining a number of holes and a second side wall forming a number of pegs;
   a radiator mounted in the hood and comprising:
      a number of base plates each forming a number of pegs on one side thereof and defining a number of recesses on an opposite side thereof in alignment with the pegs; and
      a number of fin plates each being interposed between two adjacent base plates, wherein the pegs of one of the base plates extends through a neighboring fin plate to be fittingly received in the corresponding recesses of a neighboring base plate thereby connecting the fin plates and base plates together, and wherein the pegs of the base plate located immediately adjacent to the first side wall of the hood are fittingly received in the corresponding holes of the first side wall, and the recesses of the base plate located immediately adjacent to the second side wall of the hood fittingly receive the pegs of the second side wall thereby fixedly connecting the radiator to the hood.

2. The CPU heat dissipater in accordance with claim 1, wherein the hood includes a top wall located between the first and second side walls and defining a passage, and wherein the dissipater further comprises a fan mounted on the top wall and aligned with passage whereby when the fan is activated, an air flow is forced through the radiator via the passage.

3. The heat dissipater in accordance with claim 1, wherein the side walls of the hood define a first notch, each of the fin plates defines a slot in alignment with the first notch of the hood and each of the base plates defines a notch in alignment with the first notch of the hood whereby the side walls of the hood, the fin plates and the base plates together define a channel through the dissipater for accommodating a first fastener therein to secure the heat dissipater to a central processing unit.

4. The heat dissipater in accordance with claim 1, wherein the side walls of the hood define a second notch, each of the fin plates defines a first hole in alignment with the second notch of the hood, each of the base plates defines a second hole in alignment with the second notch of the hood whereby the side walls of the hood, the fin plates and the base plates together define a bore through the dissipater for accommodating a second fastener therein to secure the heat dissipater to a central processing unit.

5. The heat dissipater in accordance with claim 3, wherein the side walls of the hood define a second notch, each of the fin plates defines a first hole in alignment with the second notch of the hood, each of the base plates defines a second hole in alignment with the second notch of the hood whereby the side walls of the hood, the fin plates and the base plates together define a bore through the dissipater for accommodating a second fastener therein to secure the heat dissipater to a central processing unit.

6. The heat dissipater in accordance with claim 1, wherein each of the side walls of the hood defines two first notches, each of the fin plates defines two slots in alignment with the first notches of the hood and each of the base plates defines two notches in alignment with the first notches of the hood whereby the side walls of the hood, the fin plates and the base plates together define two channels through the dissipater for accommodating first fasteners therein for securing the heat dissipater to a central processing unit, and wherein the side walls of the hood further define three second notches whereby the first and second notches are alternately arranged, each of the fin plates defines three holes respectively aligned with the three second notches of the side walls of the hood and each base plate defines three holes respectively aligned with the three second notches of the side walls of the hood whereby three bores are defined through the heat dissipater to accommodate second fasteners for securing the heat dissipater to the central processing unit.

7. The heat dissipater in accordance with claim 1, wherein the side walls of the hood form flanges bent toward the radiator for abutting against top edges of the base plates immediately adjacent to the side walls of the hood.

8. The heat dissipater in accordance with claim 1, wherein the side walls of the hood have a certain degree of resilience whereby the two side walls can be bent away from each other to facilitate mounting of the radiator in the hood.

9. A radiator for being mounted to a heat dissipater for dissipating heat generated from a central processing unit, comprising:
    a number of base plates each having a first side forming a number of pegs and a second side defining a number of recesses in alignment with the pegs; and
    a number of fin plates each being interposed between two adjacent base plates, wherein the pegs of each base plate extend through the neighboring fin plate to be fittingly received in the corresponding recess of the neighboring base plate thereby connecting the fin plates and base plates together.

10. The radiator in accordance with claim 9, wherein each base plate has a thickness which is larger than that of the fin plate.

11. The radiator in accordance with claim 9, wherein the each fin plate defines a slot and each base plate defines a notch in alignment with the slot.

12. The radiator in accordance with claim 9, wherein each fin plate defines a first hole and each base plate defines a second hole in alignment with the first hole.

13. A radiator for being mounted to a heat dissipater for dissipating heat generated from a CPU, comprising:
    a number of base plates defining aligned first means on two opposite sides;
    a number of fin plates each of which is interposed between every two adjacent base plates and defines second means thereof; wherein
    the first means of one base plate can cooperate with the first means of another neighboring base plate and the second means of the fin plate therebetween to secure said fin plate in position, and each of the base plates includes third means cooperates with fourth means of each of the fin plates to fix the radiator to said CPU.

14. The radiator in accordance with claim 13, wherein said first means includes a peg and a corresponding aligned recess on two sides of each of the base plates, respectively, and the second means includes a hole.

15. The radiator in accordance with claim 13, wherein said third means and said fourth means are holes.

* * * * *